(12) United States Patent
Dean et al.

(10) Patent No.: US 6,713,151 B1
(45) Date of Patent: Mar. 30, 2004

(54) COMPLIANT FIBROUS THERMAL INTERFACE

(75) Inventors: Nancy F. Dean, Liberty Lake, WA (US); Roger A. Emigh, Mesa, AZ (US); Michael R. Pinter, Colbert, WA (US); Charles Smith, Escondido, CA (US); Timothy R. Knowles, Del Mar, CA (US); Mani Ahmadi, La Jolla, CA (US); Brett M. Ellman, La Jolla, CA (US); Christopher L. Seaman, San Diego, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/333,564

(22) Filed: Jun. 21, 1999

Related U.S. Application Data

(60) Provisional application No. 60/090,406, filed on Jun. 24, 1998.

(51) Int. Cl.[7] ............... B32B 33/00; H05K 7/20
(52) U.S. Cl. ............... 428/86; 428/90; 428/96; 428/97; 361/704; 361/709
(58) Field of Search ............ 428/320.2, 321.1, 428/321.5, 90, 86, 96, 97, 408; 361/704, 707, 709, 710; 427/206; 174/16.3, 17 VA

(56) References Cited

U.S. PATENT DOCUMENTS

| | | |
|---|---|---|
| 3,972,821 A | 8/1976 | Weidenbenner et al. |
| 3,973,059 A | 8/1976 | Brown et al. |
| 4,459,332 A | 7/1984 | Giglia ............ 428/86 |
| 4,485,429 A | 11/1984 | Mittal ............ 361/386 |
| 4,603,731 A | 8/1986 | Olsen ............ 165/41 |
| 4,685,987 A | 8/1987 | Fick ............ 156/247 |
| 4,849,858 A | 7/1989 | Grapes et al. |
| 4,869,954 A | 9/1989 | Squitieri |
| 5,014,161 A | 5/1991 | Lee et al. ............ 361/388 |
| 5,077,637 A | 12/1991 | Martorana et al. ............ 361/388 |
| 5,150,748 A | 9/1992 | Blackmon et al. ............ 165/41 |
| 5,213,868 A | 5/1993 | Liberty et al. |
| 5,328,087 A | 7/1994 | Nelson et al. |
| 5,402,006 A | 3/1995 | O'Donley ............ 257/796 |
| 5,455,458 A | 10/1995 | Quon et al. ............ 257/714 |
| 5,528,456 A | 6/1996 | Takahashi |
| 5,542,471 A | 8/1996 | Dickinson ............ 165/170 |
| 5,585,671 A | 12/1996 | Nagesh et al. |

(List continued on next page.)

FOREIGN PATENT DOCUMENTS

| | | | |
|---|---|---|---|
| WO | WO9728044 | 8/1997 | ............ B64G/1/50 |
| WO | WO 98/40431 | 9/1998 | |
| WO | WO99/67811 | 12/1999 | |
| WO | WO00/20525 | 4/2000 | |
| WO | WO00/33628 | 6/2000 | |

OTHER PUBLICATIONS

U.S. patent application Ser. No. 09/735,305, Smith, filed Jan. 31, 2001.

U.S. patent application Ser. No. 09/103,416, Pinter et al., filed Jun. 1998.

Bruce Hardman, Arnold Torkelson, *Silicones*, Encyclopedia of Polymer Science and Engineering, 1989, JOhn Wiley and Sons, Inc., vol. 15, Second Edition, p. 254.

Dow Corning Corporation Material Safety Data Sheet, Dow Corning 93–500 Space Grade Encapsulant–Curing Agent, p. 7 of 7.

(List continued on next page.)

*Primary Examiner*—Cheryl Juska
(74) *Attorney, Agent, or Firm*—Wells St. John P.S.

(57) ABSTRACT

Described is a fibrous thermal interface. The interface comprises flocked thermally conductive fibers embedded in an adhesive in substantially vertical orientation with portions of the fibers extending out of the adhesive. An encapsulant fills spaces between the portions of the fibers that extend out of the adhesive and beneath the free tips of the fibers.

24 Claims, 1 Drawing Sheet

U.S. PATENT DOCUMENTS

| | | |
|---|---|---|
| 5,674,585 A | 10/1997 | Ewing, Jr. et al. ............. 428/96 |
| 5,695,847 A | 12/1997 | Brown et al. ................ 428/112 |
| 5,725,707 A | 3/1998 | Koon et al. |
| 5,726,495 A | 3/1998 | Aihara et al. ................ 257/722 |
| 5,852,548 A | 12/1998 | Koon et al. .................. 361/704 |
| 5,858,537 A | 1/1999 | Brown et al. |
| 5,873,973 A | 2/1999 | Koon et al. ............... 156/272.4 |
| 5,898,570 A | 4/1999 | Koon et al. |
| 5,904,796 A | 5/1999 | Freuler et al. |
| 5,912,805 A | 6/1999 | Freuler et al. |
| 5,968,606 A | 10/1999 | Osuna et al. |
| 6,030,856 A | 2/2000 | DiStefano et al. |
| 6,054,198 A | 4/2000 | Buyan et al. |
| 6,080,605 A * | 6/2000 | Distefano et al. ........... 438/108 |
| 6,084,775 A | 7/2000 | Bartley et al. |
| 6,090,484 A | 7/2000 | Bergerson |
| 6,096,414 A | 8/2000 | Young |
| 6,197,839 B1 | 3/2001 | Genz et al. |
| 6,204,455 B1 * | 3/2001 | Gilleo et al. ................ 174/261 |
| 6,436,506 B1 | 8/2002 | Pinter et al. |

OTHER PUBLICATIONS

Dow Corning Corporation Material Safety Data Sheet, Dow Corning 93–500 Space Grade Encapsulant–Base, p. 6 of 7.

Dow Corning Corporation Material Safety Data Sheet, Dow Corning 93–500 Space Grade Encapsulant–Curing Agent, p. 1–7.

Dow Corning Corporation Material Safety Data Sheet, Dow Corning 93–500 Space Grade Encapsulant–Base, p. 1–7.

S. Bolgen, "Flocking Technology", Journal of Coated Fabrics, vol. 21, Oct. 1991, pp. 123–131.

M. Shigematsu et al., "Application of Electrostatic Flocking to Thermal Control Coating", pp. 583–586.

A. Kato et al., "Formation of a Very Low–Reflectance Surface by Electrostatic Flocking", 4th European Symposium on Space Environmental and Control Systems, Florence, Italy, Oct. 21–24, 1991, pp. 565–568.

* cited by examiner

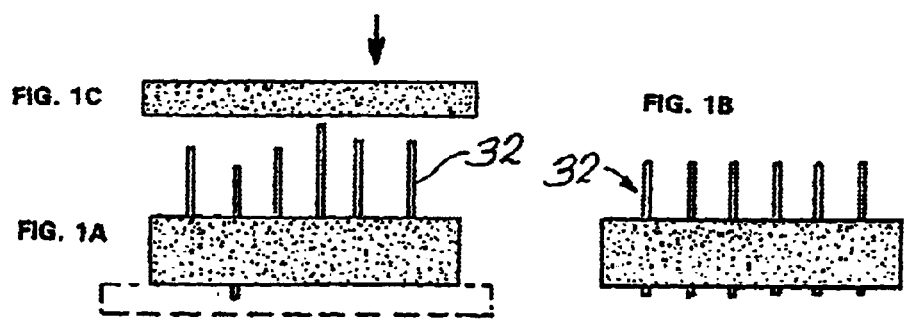
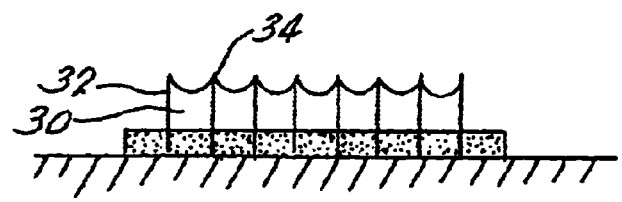

COMPLIANT FIBROUS THERMAL INTERFACE

CROSS-REFERENCE TO RELATED APPLICATION(S)

The present application is related to and claims the benefit of provisional patent application Serial No. 60/090,406, filed Jun. 24, 1998, entitled COMPLIANT FIBROUS THERMAL INTERFACE, the entire contents of which are expressly incorporated herein by reference.

BACKGROUND OF THE INVENTION

A popular practice in the industry is to use thermal grease, or grease-like materials, alone or on a carrier, or thermal pads to transfer the excess heat across physical interfaces. However, the performance of these materials breaks down or deteriorates when large deviations from surface planarity cause gaps to form between the mating surfaces or when large gaps between mating surfaces are present for other reasons, such as variation in surface heights, manufacturing tolerances, etc. When the heat to transfer ability of these materials breaks down, the performance of the device to be cooled is adversely affected. The present invention provides fibrous interfaces that deal effectively with heat transfer across physical interfaces.

BRIEF DESCRIPTION OF THE DRAWINGS

FIGS. 1A, 1B and 1C are schematic views showing flocked fibers in adhesive, pushed into the adhesive and resulting in more or less even fiber lengths extending from the adhesive; and FIG. 2 is a schematic showing encapsulant between fibers and the free-fiber tips;

SUMMARY OF THE INVENTION

In one aspect of the invention there is provided a substrate with a fibrous interface, i.e. a free fiber tip structure, attached to the substrate. The free fiber tip structure comprises flocked, e.g. electroflocked, mechanical flocked, pneumatic flocked, etc., thermally conductive fibers embedded at one end in a substrate, e.g. an adhesive, in substantially vertical orientation with portions of the fibers extending out of the adhesive. An encapsulant is disposed between the portions of the fibers that extend out of the adhesive. Disposing encapsulant material between the fibers minimizes or precludes fibers escaping the interface structure.

Another aspect of the invention is a method of making a fibrous interface. In the method, thermally conductive fibers of desired length are provided and, if necessary, cleaned. An adhesive is applied to a substrate and the fibers at one end are electroflocked to a substrate so as to embed the fibers into the adhesive with a portion of the fibers extending out of the adhesive. The adhesive is then cured and space between the fibers is filled with curable encapsulant. The fibers in the adhesive with the encapsulant in the spaces between the fibers is compressed to a height less than the nominal fiber length and clamped at the compressed height. Thereafter, the encapsulant is cured-while under compression to yield a free-fiber tip structure with the fiber tips extending out of the adhesive and encapsulant (alternatively, the adhesive and encapsulant may be cured concurrently, as hereafter discussed.)

DETAILED DESCRIPTION OF THE INVENTION

An interface material advantageously possesses a low bulk thermal resistance and a low contact resistance. A suitable material is one that conforms to the mating surfaces, e.g. wets the surfaces. The bulk thermal resistance can be expressed as a function of the material's thickness, thermal conductivity and area. The contact resistance is a measure of how well a material is able to make contact with a mating surface. This thermal resistance of an interface can be written as follows:

$$\theta \text{ interface} = \frac{t}{kA} + 2\, \theta_{contact}$$

where $\theta$ is thermal resistance
 t is material thickness
 k is thermal conductivity of material
 A is area of interface
The term $$\frac{t}{kA}$$

represents the thermal resistance of the bulk material and $2\theta_{contact}$ reflects thermal contact resistance at the two surfaces.

A good interface material should have low bulk resistance and low contact resistance, i.e. at the mating surfaces.

Many applications require that the interface material accommodate deviations from surface flatness resulting from manufacturing, and/or warpage of components due to coefficient of thermal expansion (CTE) mismatches.

A material with a low value for k, such as a thermal grease, performs well if the interface is thin, i.e. t is low. If the interface thickness increases by as little as 0.002 inches, the thermal performance can drop dramatically. Also, for such applications, differences in CTE between the mating components causes this gap to expand and contract with each temperature or power cycle. This variation of the interface thickness can cause pumping of fluid interface materials (such as grease) away from the interface.

Interfaces with a larger area are more prone to deviations from surface planarity as manufactured. To optimize thermal performance, the interface material must be able to conform to non-planar surfaces and thereby lower contact resistance.

Optimal interface materials possess a high thermal conductivity and a high mechanical compliance, e.g. will yield elastically when force is applied. High thermal conductivity reduces the first term of Equation 1 while high mechanical compliance reduces the second term. An aligned thermally conductive fibrous material can accomplish both of these goals. Properly oriented, the thermally conductive fibers will span the distance between the mating surfaces thereby allowing a continuous high conductivity path from one surface to the other. If the fiber is flexible and able to move in its tip region, better contact can be made with the surface. This will result in an excellent degree of surface contact and will minimize the contact resistance of the interface material.

To distribute or allow external heat dissipation, an interface material can be applied between the component to be cooled and an external heat dissipating device such as a heat sink. The interface material then accommodates manufacturing induced deviations from planarity from both the cooled component and heat dissipating surface component. The interface material may be applied to either the heat dissipating surface, e.g. heat sink, heat pipe, heat plate, thermoelectric cooler, etc. or to the cooled component surface. The heat dissipating device may be attached to the cooled component through the use of spring clips, bolts, or adhesive, etc. in any conventional manner.

The interface material may be made as follows:

Suitable thermally conductive fibers such as diamond fibers, carbon fibers, graphite fibers, metal fibers, e.g. copper fibers and aluminum fibers, are cut to length, e.g. from 0.0005 to about 0.250 inches and having a diameter greater than about 3 microns up to 100 microns. Presently, fibers of about 10 microns diameter are preferred. Desirable fibers have a thermal conductivity greater than about 25 W/mK. Fibers of the type that are useful include those available Amoco identified as K-1100, K-800, P-120, P-100, P-70 and T50; as well as fibers available from Toray designated M46J and M46JB.

The fibers are cleaned, if necessary. Cleaning the fibers tends to remove any coatings present on the fibers. Some commercially available fibers are sold with a coating applied to the surface which is preferably removed by cleaning. One method of cleaning is by heating the fibers in air to burn off the coating, i.e. sizing. However, chemical cleaning methods can be also used.

To produce an interface, first adhesive is applied to a substrate. Advantageously, the adhesive is a low stress adhesive, for example, an adhesive comprising epoxy (e.g. Eccobond 281 from Grace Specialty Polymers) although cyanate ester adhesive, BMI, silicones, organosilicones, gels and spray gasket materials are also useful.

The fibers are flocked to the substrate, thereby embedding the fibers in the adhesive, as shown in FIG. 1A, for example by electroflocking. Electroflocking is a well known procedure whereby two plates, separated some distance, are charged to opposite polarity. The procedure is described generically by Bolgen (Bolgen Stig W., "Flocking Technology", Journal of Coated Fabrics, Volume 21, page 123, 1991) and specifically for electroflocking of carbon Fibers by Shigematsu in "Application of Electrostatic Flocking to Thermal Control Coating", Proceedings of the 14th International Symposium on Space Technology and Science, 1984, page 583; and by Kato in "Formation of a Very Low-reflectance Surface by Electrostatic Flocking", Proceedings of the 4th European Symposium on Space Environmental and Control Systems, 1991, page 565. The disclosure of these articles is expressly incorporated herein by reference.

In the electroflocking process, fibers on one plate pick up that plate's charge and become attracted to the opposite plate. They embed in the adhesive when they hit the opposite plate. If they do not stick initially, fibers bounce back and forth between plates until they become embedded in the adhesive or escape the electric field or the charge on the plates is removed. The fiber structure that results is aligned with respect to the electric field lines, i.e. has a substantially vertical orientation, and has a velvet-like appearance.

Mechanical flocking involves passing an adhesive coated object over a series of rapidly rotating rollers or beater bars, which cause the substrate to vibrate. Fibers are fed onto the substrate by gravity from a hopper. The vibrations produced by the rollers or beater bars orient the fibers and drive them into the adhesive. Excess fiber is removed, leaving a fiber structure with substantially vertical orientation.

Pneumatic flocking uses an airstream to deliver fibers to an adhesive coated surface. While in flight, fibers align themselves in the direction of the airflow and embed in the adhesive in an oriented manner.

Different flocking methods may be used alone, or in conjunction with one another, e.g., pneumatic/electrostatic flocking. With this combination method, an airstream containing fibers is directed through a nozzle. At the exit of the nozzle, a charge orients the fibers with respect to electric field lines. The fiber structure that results is also aligned, i.e., has substantial vertical orientation, but may be denser, more uniform or produced more rapidly than when either method is used alone.

The flocked fibers are seated into the adhesive with a portion of their lengths extending from the adhesive layer, referred to as "free fiber tips". After flocking, a downward force is applied to the free fiber tips to seat the fibers in the adhesive and minimize the distance between the fiber tips embedded in the adhesive and the surface substrate to which the adhesive is applied, as shown in FIGS. 1B and 1C.

The adhesive is then cured, e.g. by self-curing or application of heat. Oftentimes heating for about 30 minutes at about 150° C. may be used for curing, depending on the adhesive and curing conditions.

As shown in FIG. 2, an encapsulant, 30, for example a gel such as GE RTV6166 dielectric gel available from General Electric Corporation is introduced to fill space between fibers 32 leaving free fiber tips 34 extending from the gel. This can be done by stenciling uncured gel onto the fibers or applying the gel to the fibers and letting the gel soak or wick in. It is advantageous to use a gel that spontaneously wets the fibers and will wick into the fiber structure. The gel may or may not include a thermally conductive filler material. A release liner, e.g. waxy or silicone coated paper, may be placed on top of the fibers and uncured gel to prevent the cured gel/fiber material from sticking to a clamping fixture, and provide protection to the interface material during shipping or subsequent handling.

The interface material with uncured gel between the fibers is compressed to less than the nominal cut fiber length and clamped in place to this compressed height. For example, if the fiber is about 0.020 inches long, adhesive cured gel is introduced then clamped to a height of about 0.017 inches before curing the gel which holds the fiber at this height while the gel is cured.

The gel is then cured, e.g. thermally cured, while under compression. Heating generally accelerates curing and is desirable to create a beneficial free-fiber tip structure. Both the compression and thermal cure aid in creating the free-fiber tip structure. The thermal cure is beneficial since the CTE of the gel is higher than that of the fibers and the gel will shrink more than the fibers upon cooling to room temperature, thereby exposing more fiber tips.

In producing the interface material, the adhesive curing may be delayed to coincide with the curing of the gel. In this case, the fibers are seated at the same time as the gel and the adhesive are cured. As indicated, compression is beneficial, and curing under compression is beneficial, because the gel will maintain the cured thickness and the fibers can spring back somewhat to stick up from the gel. Cohesion of the gel to the fibers is not strong enough to keep the fibers from assuming their original position prior to curing. This results in the free fiber tips which are desirable for enhanced thermal contact with the adjacent surface(s).

It is apparent from the foregoing that various changes and modifications may be made without departing from the invention. Accordingly, the scope of the invention should be limited only by the appended claims, wherein.

What is claimed is:

1. A thermal interface comprising:

an encapsulant and a plurality of thermally conductive fibers forming a thermally conductive composite;

individual fibers having a length and the encapsulant having a thickness encapsulating a portion of the individual lengths of the plurality of fibers; and an average length of the fibers being greater than an average thickness of the encapsulant along an average direction of the fiber lengths.

2. The interface of claim 1 wherein the thermally conductive composite further includes a support material, the fibers being in the support material and the encapsulant being on the support material.

3. The interface of claim 2 wherein the encapsulant and support material together encapsulate more of the individual lengths of the plurality of fibers than just one end.

4. The interface of claim 2 wherein the encapsulant and support material have a combined thickness encapsulating approximately 85% of the individual lengths of the plurality of fibers.

5. The interface of claim 2 wherein the support material comprises an adhesive.

6. The interface of claim 1 wherein the encapsulant comprises a gel.

7. The interface of claim 1 wherein the encapsulant comprises a polymeric.

8. A thermal interface comprising:
 a plurality of thermally conductive fibers embedded in a support material, the support material having a first surface and a second opposing surface and the fibers having first portions that extend upwardly out of the second opposing surface of the support material;
 an encapsulant between the first portions of the fibers and over the support material, the support material, encapsulant, and fibers forming a thermally conductive composite; and
 a third surface defining an outermost surface of the thermally conductive composite except for the fiber first portions terminating in tips that are elevationally above the third surface and the encapsulant.

9. The interface of claim 8 wherein the support material comprises an adhesive.

10. The interface of claim 8 wherein the first surface opposes the third surface and defines another outermost surface of the thermally conductive composite, an average length of the fibers being greater than an average thickness from the first surface to the third surface along an average direction of the fiber lengths.

11. A thermally conductive structure, comprising:
 a layer of adhesive having a pair of opposing surfaces, the opposing surfaces being a first opposing surface and a second opposing surface;
 a plurality of thermally conductive fibers embedded in the adhesive, the fibers having first portions which extend out of the second opposing surface of the layer of adhesive and upwardly from the second opposing surface, the first portions terminating in tips above the second opposing surface of the layer of adhesive, the tips being at a same height above the second opposing surface as one another; the thermally conductive fibers being selected from the group consisting of carbon fibers, metal fibers, and ceramic fibers; and
 an encapsulant between the first portions of the fibers and over the adhesive, the tips of the fibers extending to above the encapsulant.

12. The thermally conductive structure of claim 11 wherein the upwardly extending first portions are parallel to one another and perpendicular to the second opposing surface.

13. The thermally conductive structure of claim 11 wherein the thermally conductive fibers are carbon fibers.

14. The thermally conductive structure of claim 11 wherein the encapsulant is on the second opposing surface of the layer of adhesive.

15. The thermally conductive structure of claim 11 wherein the tips are at a same height above the second opposing surface as one another.

16. A thermally conductive structure, comprising:
 a layer of adhesive having a pair of opposing surfaces, the opposing surfaces being a first opposing surface and a second opposing surface, the first and second surfaces being spaced from one another along a direction defined as a vertical direction;
 a plurality of flocked, thermally conductive fibers embedded in the adhesive, the fibers having first portions which extend upwardly out of the second opposing surface of the layer of adhesive in substantially vertical orientation;
 an encapsulant between the first portions of the fibers and over the adhesive; and
 a third surface defining an outermost surface of the thermally conductive structure except for the fiber first portions terminating in tips above the third surface and the encapsulant.

17. The thermally conductive structure of claim 16 wherein the third surface comprising a surface of the encapsulant.

18. The thermally conductive structure of claim 16 wherein the thermally conductive fibers are carbon fibers.

19. A thermally conductive structure, comprising:
 a layer of adhesive having a pair of opposing surfaces, the opposing surfaces being a first opposing surface and a second opposing surface, the first and second surfaces being spaced from one another along a direction defined as a vertical direction;
 a plurality of flocked, thermally conductive fibers embedded in the adhesive, the fibers having first portions which extend upwardly out of the second opposing surface of the layer of adhesive in substantially vertical orientation, the fiber first portions terminating in tips above the second opposing surface of the layer of adhesive; and
 an encapsulant over the adhesive, between the first portions of the fibers, and beneath free tips of the fibers.

20. A method of making a thermal interface comprising:
 combining an encapsulant with a plurality of thermally conductive fibers, individual fibers having a length and the encapsulant having a thickness;
 encapsulating a portion of the individual lengths of the plurality of fibers, an average length of the fibers being greater than an average thickness of the encapsulant along an average direction of the fiber lengths; and
 forming a thermally conductive composite from the encapsulant and the fibers.

21. The method of claim 20 further comprising applying fibers into a support material and applying the encapsulant on the support material.

22. A method of making thermal interface comprising:
 embedding a plurality of thermally conductive fibers in a support material, the support material having a first surface and a second opposing surface and the fibers having first portions that extend upwardly out of the second opposing surface of the support material;
 applying an encapsulant between the first portions of the fibers and over the support material, the support material, encapsulant, and fibers forming a thermally conductive composite;
 forming a third surface defining an outermost surface of the thermally conductive composite except for the fiber terminating in tips that are elevationally above the third surface and the encapsulant.

23. The method of claim 22 wherein the encapsulant comprises a gel.

24. The method of claim 22 wherein the first surface opposes the third surface and defines another outermost surface of the thermally conductive composite, and average length of the fibers being greater than an average thickness from the first surface to the third surface along an average direction of the fiber lengths.

* * * * *